United States Patent [19]
Galyon et al.

[11] Patent Number: 5,812,372
[45] Date of Patent: *Sep. 22, 1998

[54] TUBE IN PLATE HEAT SINK

[75] Inventors: George Tipton Galyon, Fishkill; Randall Gail Kemink; Roger Ray Schmidt, both of Poughkeepsie, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 660,435

[22] Filed: Jun. 7, 1996

[51] Int. Cl.⁶ ...................................................... H05K 7/20
[52] U.S. Cl. ...................... 361/699; 165/80.4; 174/15.1; 257/714
[58] Field of Search ................................. 165/80.2, 80.4, 165/185; 174/16.3, 15.1, 252, 255–256; 257/714; 361/689, 698–704, 707, 711, 719–721

[56] References Cited

U.S. PATENT DOCUMENTS

| | | | |
|---|---|---|---|
| 3,651,865 | 3/1972 | Feldmanis | 165/80.4 |
| 4,155,402 | 5/1979 | Just | 174/16.3 |
| 4,551,787 | 11/1985 | Mittal et al. | 361/702 |
| 4,631,636 | 12/1986 | Andrews | 361/699 |
| 4,720,981 | 1/1988 | Helt et al. | |
| 4,744,008 | 5/1988 | Black et al. | |
| 4,788,767 | 12/1988 | Desai et al. | |
| 4,884,168 | 11/1989 | August et al. | 361/702 |
| 4,971,144 | 11/1990 | Gibson et al. | 361/699 |
| 5,012,860 | 5/1991 | Mukherjee | |
| 5,255,738 | 10/1993 | Przilas | 361/702 |
| 5,386,341 | 1/1995 | Olson et al. | |
| 5,394,936 | 3/1995 | Budelman | |
| 5,510,958 | 4/1996 | Shimabara et al. | 361/699 |
| 5,620,646 | 4/1997 | Sparer et al. | 361/699 |

FOREIGN PATENT DOCUMENTS 5102356  4/1993  Japan.

*Primary Examiner*—Gregory D. Thompson
*Attorney, Agent, or Firm*—Lily Neff

[57] ABSTRACT

A specially designed cooling device is proposed comprising of a light weight plate with apertures. Thin walled coolant passage tubes are provided in the apertures for the passage of a coolant. The coolant passages are made out of a material, preferably different than the plate itself and are to provide better heat dissipation than the plate and also prohibit liquid leakage. The cooling device is specially designed to accommodate an electronic assembly's geometry.

25 Claims, 3 Drawing Sheets

VIEW 2-2

TUBE IN PLATE HEAT SINK

FIELD OF THE INVENTION

This invention relates to an apparatus designed for regulating thermal equilibrium in an electronic assembly, and more particularly to a water cooling heat sink for cooling semiconductor packages mounted to an integrated circuit board.

BACKGROUND OF THE INVENTION

As integrated circuits become more complex, the circuit density of the chips increases. As this density increases, the thermal properties of a circuit package becomes a more important concern. The ability to remove heat generated from the high-powered and highly dense integrated circuits in a semi-conductor packaging becomes vital to the function and performance of the electronics. The traditional method for cooling electrical devices has been through the use of air convection, a method operating on the idea of dissipating heat through the outer surfaces of the device and ultimately cooling it through the use of an airflow, usually driven by a fan. However, as the density and integration level of the integrated circuits along with the power requirements and the operating speed of the device all increase, the amount of heat dissipated by the system can no longer be adequately removed through the use of conventional air convection techniques. Even in cases where an adequate heat sink can be designed for removing the amount of dissipated heat, the physical size of this heat sink, which is of particular concern for compact devices such as laptop computers, becomes prohibitive.

The heat removal problem is further compounded by the geometry of the circuit board and its modules. Often an array of electronic modules are mounted on a flat printed circuit board. The modules may be of different shapes and geometry and therefore the height of a particular module can be much higher or lower than that of its neighbors.

Two problems occur with this kind of module configuration. First the module powers may be too high to be cooled by air cooling techniques along with the reasons described earlier. Therefore, the power levels dictate that liquid cooling should be used. Further, the second level packaging dictates a set of geometric constraints on the solution limiting the space available for cooling. In some cases printed circuit cards plug radially into a horizontally located mother board. Thus, those components near the center of the second level package are afforded less space for cooling hardware than those at the outer radii. Light weight, low cost, material compatibility and no coolant leaks are other application requirements, especially when the preferred coolant is water.

SUMMARY OF THE INVENTION

Accordingly, an object of the present invention is to provide an apparatus for cooling of electronic devices able to accommodate a variety of geometric constraints.

Another object of the present invention is to provide an apparatus for uniform cooling of electronic modules, accommodating the cooling of all components regardless of their location on an integrated circuit board.

Yet another object of the present invention is provide for a light weight, low cost solution to the problem of cooling electronic devices.

A further object of the present invention is to provide for an apparatus for cooling of electronic devices that takes into account the problem of module's material compatibility.

Yet a further object of the present invention is to provide a leak free apparatus utilizing liquids and fluids for cooling of electronic devices.

Yet another object of the present invention is to provide an apparatus for cooling electronic devices that can cool the electronic device independent of the orientation or the position of the device itself.

To achieve the above-mentioned objects, an apparatus for cooling electronic devices mounted on an electronic assembly is proposed. The assembly has at least one board for housing electronic modules. The apparatus itself comprises a light weight plate with holes or apertures at least partially embedded in it. The plate is designed to be geometrically complimentary to the shape of the assembly to accommodate height differences of the modules. A plurality of coolant passage tubes with thin walls and hollow centers are also designed for coolant flow. The coolant passages tubes (also referred to as coolant passages hereinafter) are then placed inside the apertures in thermal contact with the plate. The coolant passages are made of a material, such as copper, known to have excellent thermal characteristics.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 2:
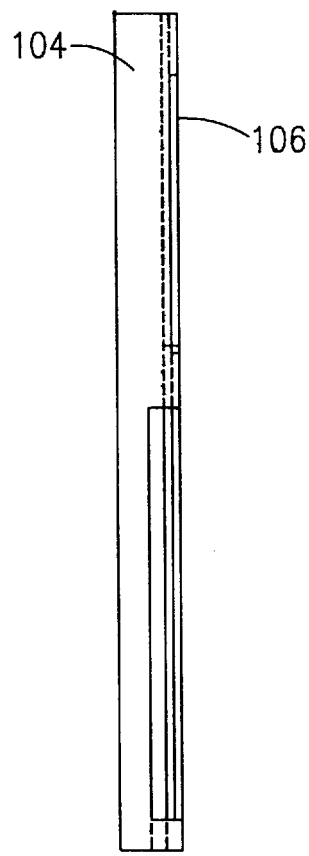
FIG. 2 is front view diagram of an system illustrating the cooling methods used in an embodiment of the present invention.

FIG. 2 illustrates an array of electronic modules mounted on a flat printed circuit. A plurality of modules of different heights and shapes are mounted on the board surface. When the module powers are sufficiently low, a conventional air cooling system can be used to solve the thermal problem caused by the heat dissipated by the modules. However, when the module powers are high, an air cooling arrangement is no longer sufficient in resolving the problem. With high module powers, the power levels dictate that some form of liquid cooling be utilized.

Several cooling approaches have been used in the past including: a) using a single internally finned cold plate; b) using forced convection methods utilizing florinerts such as FC-77, where the florinert is pumped over and around the electronic components to carry away dissipated heat; c) using individual water cooled cold plates on each component with the cold plates being connected in series or parallel with a flexible tubing such as a rubber hose of tygon tube; and d) using individual water cooled spreader plates provided on each component with the spreader plates being linked by a single copper tubing through which water flows serially from one spreader plate to the next.

However, each of the cooling methods as described did not adequately resolve the challenges presented by different module geometry and orientation placement of the modules on the board as the board became incorporated in another electronic assembly.

One solution was to use a single internally finned cold plate, but in the process one would have to sacrifice either the weight of the device (in order to make it light weight), or sacrifice the material compatibility (even that of the coolant). A single design could either meet one requirement or the other but not both at the same time. For example, the use of florinerts limits the cooling capability of the assembly. Due to special issues regarding coolant containment and material compatibility since not every material can be used for florinert's containment. The use of individual cold plates implies the need of two fluid connections from which fluid can more readily leak onto the electronic components. The use of individual spreader plates has the potential problem of placing additional mechanical stresses on the module to printed circuit card connection since it would be difficult if not impossible to insure all individual spreader plate surfaces were in the appropriate plane.

Figure 1:
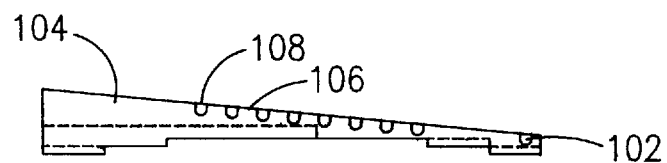
FIG. 1 is the top view illustration of one embodiment of the present invention.

The present cooling system shown in FIGS. 1 and 2 addresses many of the concerns with the prior art methods of cooling. In one embodiment of the present invention, as illustrated in FIG. 1, an aluminum plate 104 provides thermal spreading and serves as a substrate for a thin walled coolant carrying copper tubes 106. The coolant 108 is preferably water. The aluminum plate provides a rigid structure to is which the board/module 102 assembly can be mechanically attached. The plate also provides for a shape transformation from the top surfaces of the modules to the copper tubing coolant passages.

In the present arrangement, heat dissipated within the electronic module passes across a module to plate's thermal interface and spreads through the aluminum plate, passes across the plate to copper tubing interface and is convected away by water flowing through the copper tubing.

In one embodiment of the present invention the aluminum plate is actually wedge shaped, with one side of it being thicker than the opposing side. This wedge shaped geometry will allow the control of heat dissipation. A thicker section of the material allows for better heat dissipation while a thinner portion of the material allows shorter access to the water or other liquid coolants. In addition the change in material thickness can also be used in ensuring a better fit in terms of geometry between the plate and the modules.

FIG. 2 is a detailed diagram of one embodiment of the present invention, illustrating a front view orientation. Numbers are used as an example to indicate spacial orientation and measurements. A left side view is provided in FIG. 5 when the assembly of FIG. 2 is rotated along the line 7 to provide a different orientation of the aluminum plate 104 and copper tubing 106.

Figure 3:
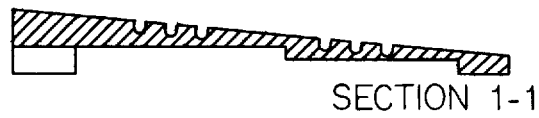
FIG. 3 illustrates different details of the embodiment shown in FIG. 2 and cut along line A—A.
Figure 4A:
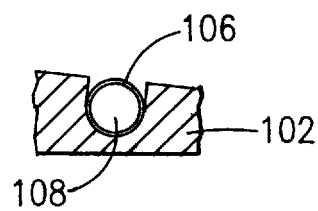
FIG. 4A is an alternate embodiment of the present invention.
Figure 4B:
FIG. 4B illustrates different details of the embodiment shown in FIG. 2 and cut along the line C—C.

FIG. 3 and FIG. 4B are illustrations of embodiments of the present invention as shown in FIG. 2. FIG. 3 provides an illustration of the embodiment of FIG. 2 when a cross sectional cut is provided along the lines A—A. Similarly, FIG. 4B provides an illustration of a cutaway sectional view of FIG. 2 when cut along the lines C—C. FIG. 4A shows an alternate embodiment of the present invention reflecting a different placement of tube in the plate.

Figure 5:
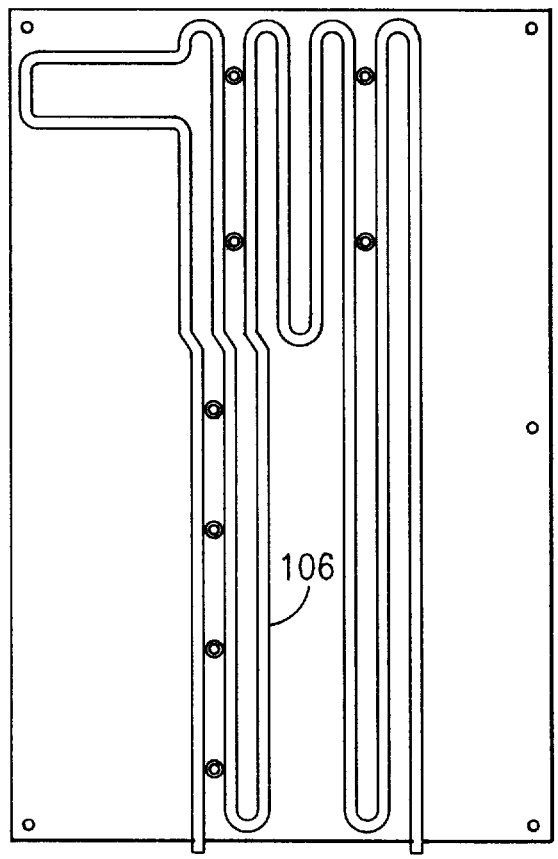
FIG. 5 is an illustration of the tube surfaces as installed on a cold plate.

FIG. 5 illustrates one embodiment of the present invention as shown in FIG. 1 but rotated clockwise along the line B—B. (Copper tubing is still indicated by number 106.) Channels are machined in the back surface of the aluminum plate and copper tubing 106 formed to the desired geometry is laid in the channels and bonded to the plate as shown in FIG. 5. The opposite surface of the plate is machined to provide a mating geometry with the top cold plate and board that are mechanically, or otherwise, fastened together. Additionally, it is from this surface that material is removed where necessary to accommodate geometrical constraints dictated by the second level packaging.

The copper tubing is bonded to the aluminum plating. The bonding can be done through the use of a thermal epoxy. The bonding can be also accomplished by soldering the copper tubing to the aluminum plate. The above two bonding methods, however, were only used as means of example and the bonding can be accomplished by using other commercially available techniques.

In another embodiment of the present invention, the electronic modules are mechanically attached to the aluminum plate. A threaded stud, is an integral part of the module cap, passes up through a clearance hole in the cold plate. A nut is then used to draw the thermal surfaces of the aluminum plate and the electronic module into good thermal contact. Interface materials between the aluminum plate and modules such as a flexible silicone pad, grease or oil are optional. The flex circuit which attaches the electronic module to the board accommodates small dimensional tolerances.

Figure 6A:
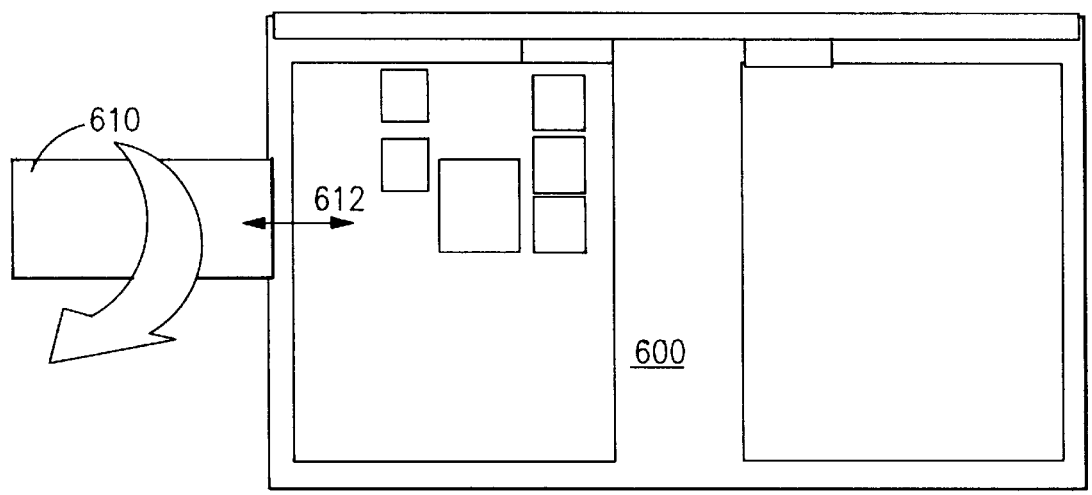
FIG. 6A is an illustration of a device according to one embodiment of present invention mounted on a test head.
Figure 6B:
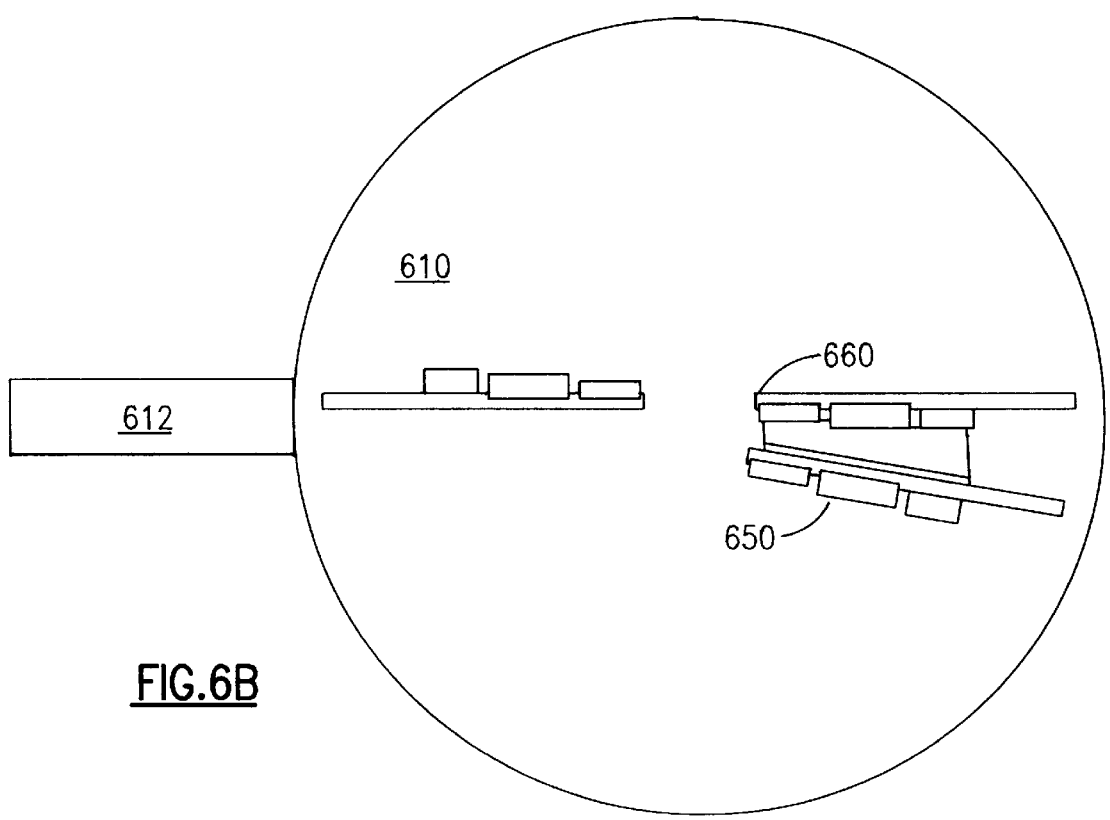
FIG. 6B is a detailed portion of the embodiment shown in FIG. 6A.

Because the cooling system of the present invention is fastened in the manner shown in the FIGS. 1–5 to the aluminum plate, the coolant will flow independent of the orientation of the device in which the modules will be installed. FIGS. 6A and 6B show an example of such a device 600. The present cooling system will be installed on the test element 610 of the device 600. Lever 612 can displace the test element in the vertical direction or even rotate it 180 degrees (in a clockwise-counterclockwise direction.) No matter what the orientation of the test element or ultimately of the cooling system of the present invention 660 or the modules 650, the present cooling system and apparatus will be functional and operational, an advantage which is not observed in cooling schemes that utilize heat pipe technologies. The cooling system of the present invention, is therefore independent of its orientation.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An apparatus for cooling electronic modules in an electronic assembly, said assembly having at least one board that houses a plurality of electronic modules, said apparatus comprising:

a light weight plate having a top surface and an underside, said underside shaped specifically to cater to height and size configurations of all modules in a manner so that said underside have a step like structure;

said plate also having different thicknesses in different areas as to aid the process of heat dissipation;

a plurality of coolant passage tubes having thin walls and hollow centers for coolant flow provided inside said plate;

said coolant passages tubes being placed in thermal contact with said plate's top surface and said electronic assembly; and said coolant passage tubes being of a different material than said plate, said coolant passage tubes being a better heat dissipator than said plate.

2. The apparatus of claim 1, wherein said plate is further configured in a manner so that said plates cross section is wedge-shaped.

3. The apparatus of claim 1, wherein said light weight plate functions as a substrate for said coolant passages, and also provides sufficient rigidity to which said modules and board assembly can be mounted.

4. The apparatus of claim 1, wherein said plate is thicker on one side and thinner on an opposing side.

5. The apparatus of claim 1, wherein said plate is made of aluminum.

6. The apparatus of claim 1, wherein said coolant passages have thin walls and are made of copper.

7. The apparatus of claim 1, wherein said coolant passages are bonded to said plate.

8. The apparatus of claim 1, wherein said coolant is water.

9. The apparatus of claim 1, wherein said coolant passage tubes are made out of copper and said plate is made out of aluminum.

10. The apparatus of claim 9, wherein an interface layer is provided between said plate and any existing modules.

11. The apparatus of claim 10, wherein said interface layer is made of a flexible filled silicone pad.

12. The apparatus of claim 10, wherein said interface layer is grease.

13. The apparatus of claim 10, wherein said interface layer provided is a layer of oil.

14. A heat sink for cooling electronic components in an electronic assembly having a plurality of modules, said heat sink comprising:

a light weight plate having apertures, said plate having at least a first and a second portion, said first portion being thinner than said second portion;

said plate also having a top surface and an underside, said underside shaped specifically to cater to height and size configurations of all modules in a manner so that said underside has a step like structure;

a plurality of thin coolant passage tubes placed in said plate's apertures, said tubes being substantially cylindrical in shape and having hollow centers for coolant flow;

said heat sink providing for a shape transformation from top surfaces of the modules to said coolant passages;

said hollow centered cooling passage tubes being of a different material than said plate; and said tubes being of a material with better thermal characteristics than said plate and being resistant as to coolant leakage.

15. The apparatus of claim 14, wherein said plate is wedge shaped.

16. The apparatus of claim 15, wherein said plate is made of aluminum.

17. The apparatus of claim 16, wherein said hollow centered conduits are made of copper.

18. The apparatus of claim 14, wherein said plate has apertures for placement of said coolant passages and said coolant passages are bonded to said plate by use of a thermal epoxy.

19. The apparatus of claim 18, wherein said plate has apertures for placement of said coolant passages and said coolant passages are bonded to said plate by use of thermal epoxy in mechanical conjunction with a thermal grease.

20. The apparatus of claim 19, wherein said plate has apertures for placement of said coolant passages and said coolant passages are bonded to said plate by means of soldering said coolant passages to said plate.

21. The apparatus of claim 16, wherein said coolant is water.

22. The apparatus of claim 16, wherein an interface layer is provided between said plate and any existing modules.

23. The apparatus of claim 22, wherein said interface layer provided is a flexible filled silicone pad.

24. The apparatus of claim 22, wherein said interface layer is a layer of grease.

25. The apparatus of claim 22, wherein said interface layer is a layer of oil.

* * * * *